United States Patent [19]
Mussenden

[11] Patent Number: 6,060,879
[45] Date of Patent: *May 9, 2000

[54] CURRENT MAGNITUDE SENSING CIRCUIT

[75] Inventor: Georg A. Mussenden, Boca Raton, Fla.

[73] Assignee: CORE Engineering Inc., Boca Raton, Fla.

[*] Notice: This patent issued on a continued prosecution application filed under 37 CFR 1.53(d), and is subject to the twenty year patent term provisions of 35 U.S.C. 154(a)(2).

[21] Appl. No.: 08/696,216

[22] Filed: Aug. 12, 1996

Related U.S. Application Data

[60] Provisional application No. 60/003,363, Sep. 7, 1995.

[51] Int. Cl.$^7$ .......................... G01R 23/15; G01P 3/481; G08B 23/00
[52] U.S. Cl. ........................... 324/76.39; 324/76.41; 324/166; 324/177; 340/648; 340/658
[58] Field of Search ................. 324/772, 545, 324/166, 177, 76.39, 76.41, 76.47, 76.48; 340/635, 648, 658, 671; 310/68 B, 68 C

[56] References Cited

U.S. PATENT DOCUMENTS

| | | | |
|---|---|---|---|
| 2,561,357 | 7/1951 | Garfield | 340/658 |
| 3,739,367 | 6/1973 | Fathauer | 340/658 |
| 4,479,115 | 10/1984 | Holzhauer | 340/635 X |
| 4,544,852 | 10/1985 | Moosmann et al. | 307/519 |
| 4,977,375 | 12/1990 | Toth | 340/648 X |
| 5,469,148 | 11/1995 | Baumann et al. | 340/635 X |
| 5,514,977 | 5/1996 | Agiman | 340/648 X |
| 5,534,854 | 7/1996 | Bradbury et al. | 324/166 X |

FOREIGN PATENT DOCUMENTS

| | | |
|---|---|---|
| 0 340 479 A2 | 4/1989 | European Pat. Off. |
| 2 045 950 | 11/1980 | United Kingdom . |
| 2 247 999 | 3/1992 | United Kingdom . |

OTHER PUBLICATIONS

"Brushless DC Motor Fault Detection Circuit" IBM Technical Disclosure Bulletin, vol. 37, No. 12 Dec. 1994, pp. 281–282 XP–002060283.

Comair Rotron, Inc., "DC Fan Performance Sensor (FPS)", Product Catalogue Fans, Blowers, Accessories, pp. 58–59, Cat. No.:COM8019 10M, © May 1995.

Comair Rotron, Inc., "Tachometer Output Option", Product Catalogue Fans, Blowers, Accessories, pp. 60–61, Cat. No.:COM8019 10M, © May 1995.

CORE Engineering, Inc., "Schematic Fan 1 & 2 Fail Sense", Internal Circuit Schematic for Fan Current Sensing Circuit dated Oct. 27, 1993.

*Primary Examiner*—Daniel S. Larkin
*Attorney, Agent, or Firm*—Graham & James LLP

[57] ABSTRACT

A current magnitude sensing circuit for detecting a malfunction of a DC brushless fan. The current magnitude sensing circuit detects drops in the current magnitude in windings of a fan motor. Depending on the frequency of the current drops in the fan current, the current magnitude sensing circuit outputs either a high or a low voltage signal. The current magnitude sensing circuit operates by charging a capacitor beyond a certain voltage and thereby providing a high fan fail output signal when a fan is spinning too slowly for proper cooling of a device. Another capacitor is charged at a different time constant for setting the fan fail output of the current magnitude circuit low for indicating that the fan is spinning sufficiently fast.

14 Claims, 5 Drawing Sheets

FAN MALFUNCTION DETECTION CIRCUIT DIAGRAM
BEFORE DROP IN COMMUTATION CURRENT OF FAN
OPERATING AT PROPER SPEED OF ROTATION

FAN MALFUNCTION DETECTION CIRCUIT DIAGRAM DURING DROP IN COMMUTATION CURRENT OF FAN OPERATING AT PROPER SPEED OF ROTATION

FAN MALFUNCTION DETECTION CIRCUIT DIAGRAM FOR DETECTING FAN FAILURE WITH PROCESSOR

CURRENT MAGNITUDE SENSING CIRCUIT

This application claims the benefit of U.S. Provisional Application No. 60/003,363, entitled "CIRCUIT FOR DETECTING FAILURE IN DC-BRUSHLESS FANS," filled Sep. 7, 1995, which is hereby incorporated by reference.

BACKGROUND OF THE INVENTION

Systems, such as computers, use fans to air cool individual components of the systems. Typically, a fan has to spin at a certain minimum speed to provide sufficient cooling to the components of a system. However, sometimes fans fail completely. At other times, they spin too slowly to prevent damage to the system's components from overheating.

A typical fan for use in electronic systems is an electronically commutated (i.e. brushless) DC (direct current) fan. The fan includes a DC motor with windings through which fan current flows. An integrated circuit commutates the fan current. Some manufacturers provide a TTL (transistor-transistor logic) pulse for every revolution of the fan. Such a logic pulse provides the capability of generating a tachometer function that indicates the fan's number of revolutions, for example, per minute. However, fans are not always available even for a higher price with this special TTL logic pulse option.

Other manufacturers use thermistors to detect that fans are rotating too slowly. A thermistor typically is heated by a power resistor. The power resistor, in turn, is sufficiently cooled by a properly operating fan. If the power resistor heats up due to a fan malfunction, then the thermistor provides an indication of the fan's failure. However, using thermistors is energy inefficient and cumbersome.

Furthermore, all these methods require an additional wire lead to the fan assembly. In installations where a large number of fans are installed, these methods can significantly increase the amount of wiring to such fans.

SUMMARY OF THE INVENTION

An apparatus and method for using drops in a magnitude of a current for detecting the condition of an associated apparatus that uses the current. In particular, the invention includes a circuit for detecting drops in current of, for instance, a DC brushless fan, during the fan current's electronic commutation by use of a resistor/capacitor circuit for turning on and off a transistor, thereby providing an indication of the frequency of fan current drops events.

From a system point of view, a preferred embodiment of the invention comprises an apparatus for sensing a frequency of changes in magnitude of a current. The apparatus comprises a pulse-rate decision circuit providing an output signal indicative of the frequency of changes in the current magnitude relative to a frequency value. The apparatus further comprises a pulse detection portion for coupling to the current and coupled to the pulse-rate decision portion for providing a trigger signal to the pulse-rate decision portion depending on the frequency of changes in current magnitude relative to the frequency value.

From a process point of view, a preferred embodiment of the invention includes the following steps: generating an output signal indicative of the frequency of changes in the current magnitude relative to a frequency value. Providing a trigger signal depending on the frequency of changes in current magnitude relative to the frequency value.

DETAILED DESCRIPTION OF THE PREFERRED EMBODIMENTS

Current used to drive electrical devices can sometimes be used to ascertain the status of those electrical devices, such as a DC brushless fan, i.e. a fan that is electronically commutated. Such a fan exhibits drops in magnitude of a current that flows in windings of the DC motor of the fan, as a function of the speed of the fan's rotation. For the vast majority of DC brushless fans available, such current drop events occur four times per revolution, i.e., four times per period of the fan's rotation due to commutation of the fan current by an integrated circuit. By sensing changes in the current, a detection circuit in accordance with an embodiment of this invention can detect proper operation of an electrical device, such as the brushless fan, powered by a motor, without the need for any additional leads to the fan.

For proper cooling of different devices by a fan, the fan may need to operate at a minimum speed (i.e. at a frequency of rotation of a certain minimum value; the frequency of rotation equals the inverse of the period of rotation). Depending on the particular minimum fan rotation speed for proper cooling of a particular device, the maximum period of rotation of the fan will determine the maximum allowable time between fan motor current drop events. When the current drop events occur at time intervals smaller than those required of a properly functioning fan, then the detection circuit signals that the fan is operating properly.

Figure 1:
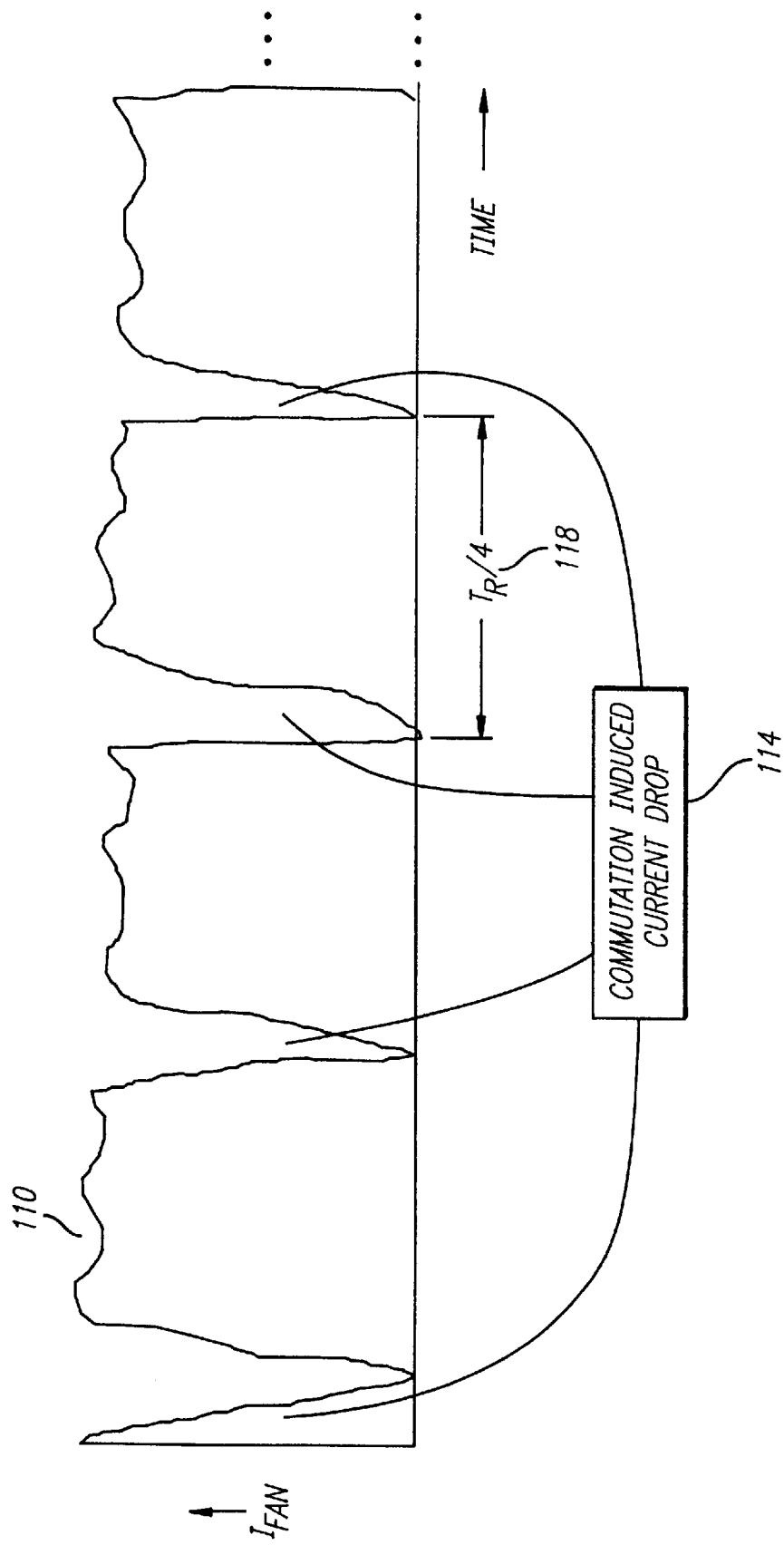
FIG. 1 illustrates fan current vs. time of a typical DC brushless fan.

FIG. 1 illustrates a fan current 110 vs. time of a typical DC brushless fan. The fan current 110 periodically exhibits drops 114 in magnitude. Typically the current 110 has four drops in one period of rotation $T_R$. One-fourth of such a period of rotation 118 is shown in FIG. 1.

Figure 2:
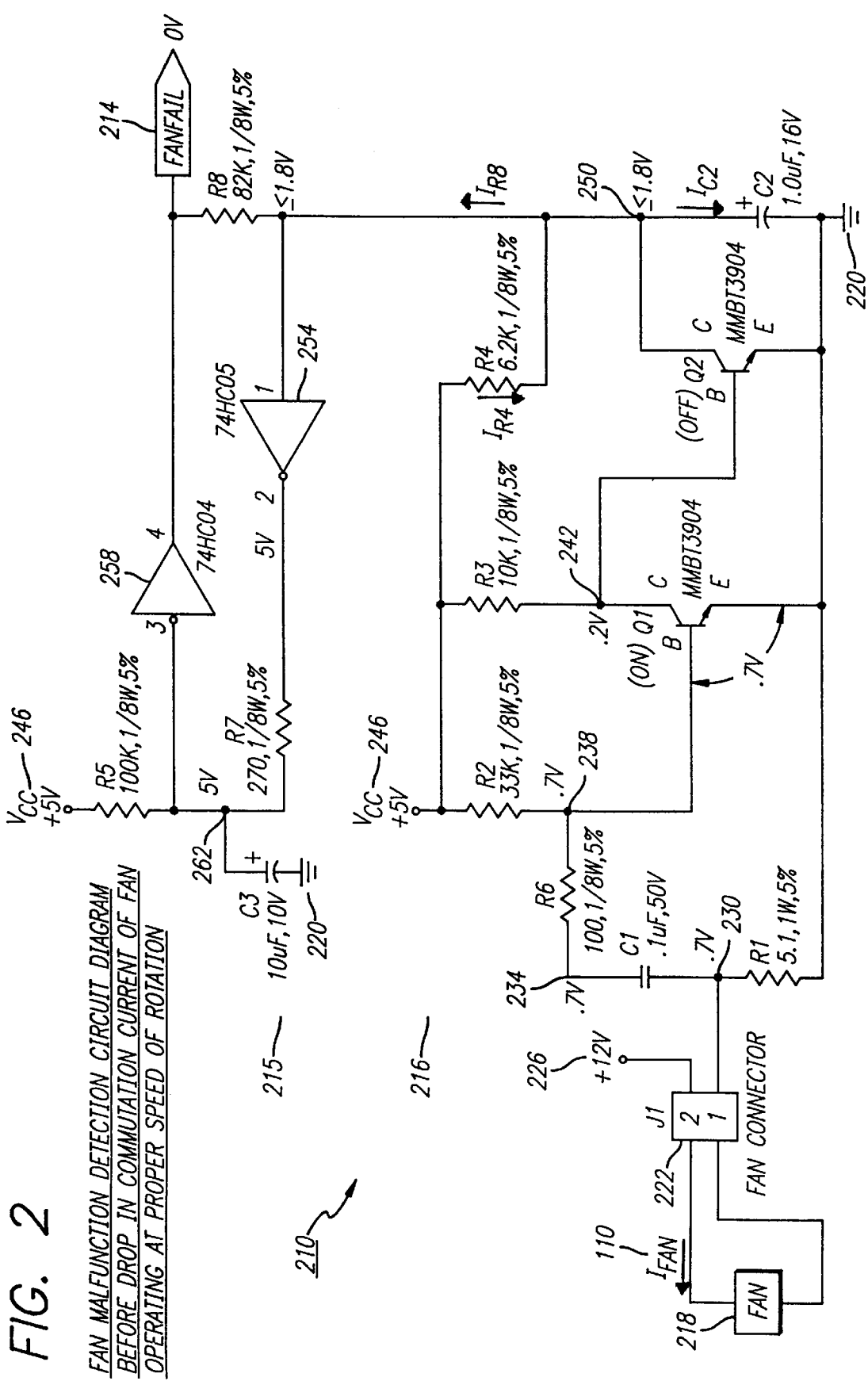
FIG. 2 is a circuit diagram of a fan malfunction detection circuit illustrating voltages and currents present in the fan malfunction detection circuit for a DC brushless fan spinning sufficiently fast for proper cooling of a device, in accordance with a preferred embodiment of the invention.

A fan malfunction detection circuit 210 (see FIG. 2) provides a fan fail output 214 (see FIG. 2). A low voltage, such as 0 volts, at the fan fail output 214 indicates that the drops in fan current 114 occur at a period smaller than a maximum period required to consider the fan motor to be functioning at an acceptable level. Similarly a high voltage, such as 5 volts, at the fan fail output 214 indicates that the drops 114 in fan current 110 are occurring at insufficient frequency for proper cooling of the particular device.

FIG. 2 (and FIGS. 3 and 4) shows a circuit diagram of the fan malfunction detection circuit 210. The fan malfunction detection circuit 210 includes two portions, a pulse detection portion 216 and a pulse rate decision portion 215 coupled to each other as depicted in FIG. 2. Briefly (as discussed in greater detail below), the detection portion 216 senses the fan motor's drop events 114 and converts them into pulse signals (not shown) at node 242. Lack of such pulses or excess time between these pulses will then generate a trigger signal, i.e. a high voltage level (not shown), at node 250, when the fan's motor 218 is not spinning sufficiently fast. This high voltage level at node 250 triggers the decision portion 215 into providing a high voltage (i.e. a logical true state) at fan fail output 214.

FIG. 2 illustrates voltages and currents present in the fan malfunction detection circuit 210 for a DC brushless fan 218 operating at a period sufficiently small for the fan to be considered good. Fan 218 can be a commercially available fan, such as Model No. DC 2410 ML by NMB Technologies Incorporated. Depending on the specific model chosen, the fan current 110 for such a fan 218 can range from 170 to 300 milliamperes. The circuit shown in FIG. 2 indicates a fan failure at fan fail output 214 when the fan's revolutions per minute drop to 3080 or below. Also, the fan failure signal at fan failure output 214 is removed once the fan 218 spins at 3754 revolutions per minute or faster. The different thresholds for indicating fan failure and removing fan failure at fan fail output 214 are further discussed below. Based on the description herein, one of ordinary skill in the art will understand how to adjust these thresholds to different values.

All voltages in the figures discussed below are given with respect to ground 220. For simplicity, ground 220 is at zero volts. Since the fan current 110 of the fan 218 exhibits current drops 114 at a sufficiently high rate (i.e. frequency), the voltage at the fan fail output 214 equals 0 volts. The fan 218 may be connected to the fan malfunction detection circuit 210 via, for example, a fan connector 222. As further explained below, capacitor C2 and resistor R4 substantially provide a time-out period after which the fan fail output 214 goes high. Similarly, capacitor C3 and resistor R5 provide a reset time period after which the fan fail output 214 goes low.

A power supply 226 provides the fan motor (not shown) via the fan connector 222 with the fan current 110 for driving the fan motor at, for instance, 12 volts. The resistance value of a current sensing resistor R1 is selected, such that the average voltage at node 230 is approximately 0.7 volts with respect to ground 220, prior to current drops 114. As shown in FIG. 2, the resistance of resistor R1 is, for example, 5.1 ohms with a 5% tolerance on the resistance value and with a 1 watt maximum power handling capability. Depending on the particular noise characteristics of the circuit, the resistance of resistor R1 can be chosen to produce a voltage of less than 0.7 volts at node 230, such as 0.2 volts. As discussed further below, the resistance of resistor R1 is chosen for a proper rate of change of the voltage across resistor R1. As mentioned above, ground 220 for simplicity is at zero volts. Similarly, to node 230, the voltage at node 238 also is approximately at 0.7 volts.

This voltage at node 238 is a consequence of the fact that a typical voltage drop of 0.7 volts across a base-emitter junction (between base B and emitter E) of a bipolar junction transistor Q1 turns transistor Q1 on. When transistor Q1 is on, it can conduct collector current from its collector C to its emitter E. Transistor Q1 is an NPN transistor made by, for example, Motorola, Inc., part No. MMBT3904.

Due to the DC (direct current) blocking capacitor C1, no DC current flows through resistor R6. Capacitor C1 couples changes in current through resistor R1 to base B of transistor Q1, as further explained below. When the voltage at node 230 is less than 0.7 volts due to a resistance of resistor R1 of less than 5.1 ohms (or due to the utilization of a fan whose current consumption is lower), then the voltage drop across capacitor C1 will be greater than zero. However, still no current will flow through resistor R6, since capacitor C1 blocks current through resistor R6, when there are no changes in fan current 110. Due to transistor Q1's base-emitter junction being forward biased, the voltage at node 242 remains at about 0.2 volts, since that is a typical saturation voltage of transistor Q1.

However, a voltage of 0.2 volts at node 242 with respect to ground 220 is insufficient for forward biasing a base-emitter junction between base B and emitter E of an NPN bipolar junction transistor Q2 (for example, made by Motorola, Inc. Part No. MMBT3904). Being off means that transistor Q2 substantially does not conduct collector current into its collector C. Due to transistor Q2 being off, capacitor C2 is charged by a power supply 246 supplying current at, for example, 5 volts. Power supply 246 charges capacitor C2 via resistor R4 by supplying current $I_{R4}$ through resistor R4 in the direction of the arrow shown in FIG. 2.

Preferably, values for components (in particular capacitance of capacitor C2 and resistance of resistor R4) of the fan malfunction detection circuit 210 are selected such that for a fan operating at a proper period of rotation, the capacitor C2 charges up to a voltage of, at most, approximately 1.8 volts at node 250 prior to a drop 114 in the fan current 110. A voltage of at most about 1.8 volts at node 250 causes pin 1 of an inverter 254 to be sufficiently low for pin 2 of the inverter 254 to be open circuited as further explained below.

The inverter 254, similarly to inverter 258 discussed below, is a TTL (Transistor-Transistor Logic) CMOS (Complementary-Symmetry Metal Oxide Semiconductor) logic gate. Type numbers for inverters 254 and 258 are as shown in FIG. 2. Typically, inverter 254 has the property that its pin is 2 open circuited until the voltage at its pin 1 reaches above half of the power supply voltage 246. Therefore, allowing capacitor C2 to charge to only 1.8 volts or less for a sufficiently fast spinning fan 218 substantially prevents pin 2 of inverter 254 from accidentally going low, thereby causing a voltage at the fan fail output 214 to go high.

Due to the presence of a resistor R8, there is hysteresis in the performance of the circuit 210. In particular, the fan's 218 speed of rotation at which a fan malfunction is detected (causing the voltage at the fan fail output 214 to go high) is slightly lower than the speed at which the fan 218 has to spin before the malfunction indication is removed (i.e. the voltage at the fan fail output goes low). The range of ratios of the speeds or of the frequency of rotation of fan 218 at which a malfunction indication is removed to the frequency of rotation at which a malfunction is detected preferably is between 1.05 and 1.10. Having such differential threshold speeds is desirable, because it helps insure that a fan that has spun too slowly, thereby setting high the fan fail output 214, is unable to reset the fan fail output voltage by only marginal performance, i.e. marginal speed. Instead, the marginally performing fan will tend to be replaced by a user, thus forestalling possible complete failure of the fan at a later time.

Resistor R8 functions as follows. Resistor R8 hinders charging of capacitor C2, when the fan 218 is operating at a fast enough speed for cooling the device (not shown). This follows from the fact that since node 250 is at a higher voltage than the 0 volts at the fan fail output 214, current $I_{R8}$ flows through resistor R8 away from node 250 in the direction indicated by the arrow in FIG. 2. Due to current $I_{R8}$, charging capacitor C2 by current $I_{R4}$ takes longer than without current $I_{R8}$. Resistor R8 also swiftens charging capacitor C2, when the voltage at the fan fail output 214 is high, as further discussed below.

Returning to inverter 254, in FIG. 2, since its pin 2 is open circuited and power supply 246 also provides power at 5 volts, a voltage at node 262 is at 5 volts as well. (Implicit in FIG. 2 is the fact that capacitor C3 has had sufficient time for charging to the 5 volts at node 262.) Consequently, pin 4 of inverter 258 is low, i.e. at 0 volts. As explained above, 0 volts at the fan fail output 214 indicates that fan's 218 motor is spinning at a sufficiently fast rate.

Figure 3:
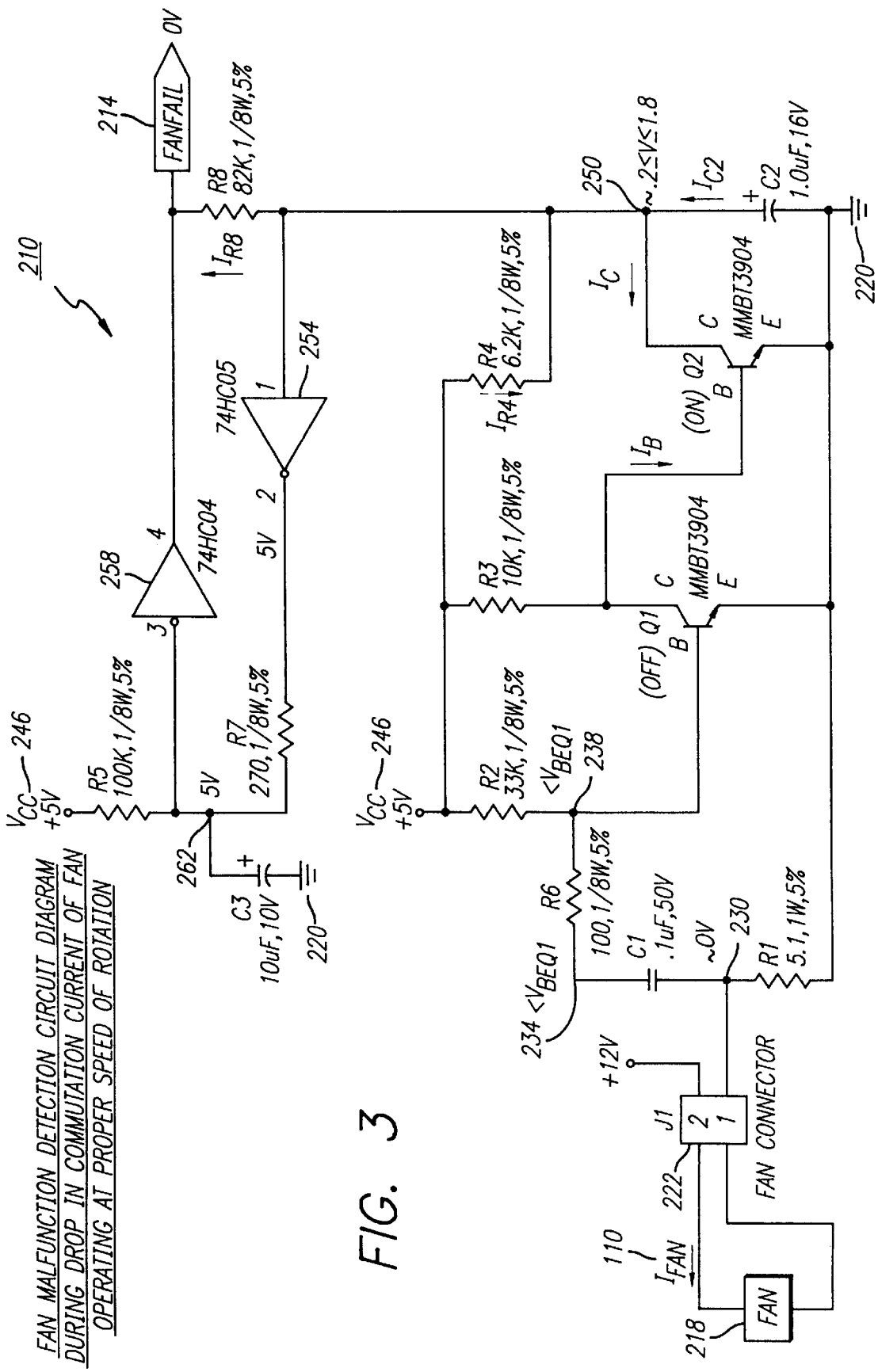
FIG. 3 is the circuit diagram for the fan malfunction detection circuit illustrating voltages and currents when the fan is spinning sufficiently fast for proper cooling of the device and when the fan current undergoes a drop in magnitude, in accordance with the preferred embodiment of FIG. 2.

FIG. 3 shows the circuit diagram of FIG. 2 for the fan malfunction detection circuit 210 illustrating voltages and currents when the fan 218 is spinning sufficiently fast for cooling the device and when the fan current 110 undergoes a drop 114 in magnitude. When a fan motor commutation event 114 is just beginning to occur, the motor's current $I_{FAN}$ 110 drops to a much lower value (possibly even zero) at a rate of $dI_{FAN}/dt$. This will cause the voltage through resistor R1 to drop at a rate $dV_{R1}/dt = R1 \times dI_{FAN}/dt$. By inspection (neglecting any small voltage drop through R6), it can be seen that if such $dV_{R1}/dt$ is fast enough, so that $C1 \times dV/dt > (V_{CC} - V_{BEQ1})/R2$, then all the base current supplied to transistor Q1 by R2 will be "stolen" by C1, thereby causing transistor Q1 to turn off. Since resistor R2 is much greater than resistor R6, node 238 will be at a sufficiently low level to turn off transistor Q1. Resistor R6 is a current limiting resistor that protects the base B of transistor Q1 from excessive current. Without resistor R6, when the fan current magnitude begins to increase following its drop 114, the fan current 110 would begin flowing via capacitor C1, which briefly acts as a short circuit, directly into the base B of transistor Q1. Instead, virtually all of the fan current 110 flows through the resistor R1, because it has a much smaller resistance than resistor R6.

Since transistor Q1 is off, power supply 246 provides base current $I_B$ to transistor Q2 via resistor R3. Having been turned on, transistor Q2 permits discharging of capacitor C2 by collector current $I_C$. Collector current $I_C$ is a function of the base current $I_B$ into the base B of Q2 and the beta of transistor Q2. The beta (the current gain $[I_C/I_B]$ of a bipolar junction transistor) typically can be between 100 and 300. Current $I_B$ in turn equals the voltage drop across resistor R3 divided by the resistance of resistor R3.

Capacitor C2 discharges to approximately 0.2 volts at node 250. The voltage at node 250 tends not to drop below about 0.2 volts, because the collector current $I_C$ is supplied in part by the current $I_{R4}$ through resistor R4. Current $I_{R4}$ through resistor R4 supplies sufficient current for the saturation voltage drop from the collector C to the emitter E of transistor Q2 to remain at about 0.2 volts, even when capacitor current $I_{C2}$ has stopped flowing in the direction of the arrow in FIG. 2. A drop of the voltage at node 250 from that discussed in the context of FIG. 2 to as low as about 0.2 volts keeps pin 2 of inverter 254 open circuited. Thus, capacitor C3 holds node 262 at 5 volts, thereby keeping the fan fail output 214 low at 0 volts. As mentioned above, this 0 volts indicates that fan 218 is spinning sufficiently fast for proper cooling of the device (not shown).

Figure 4:
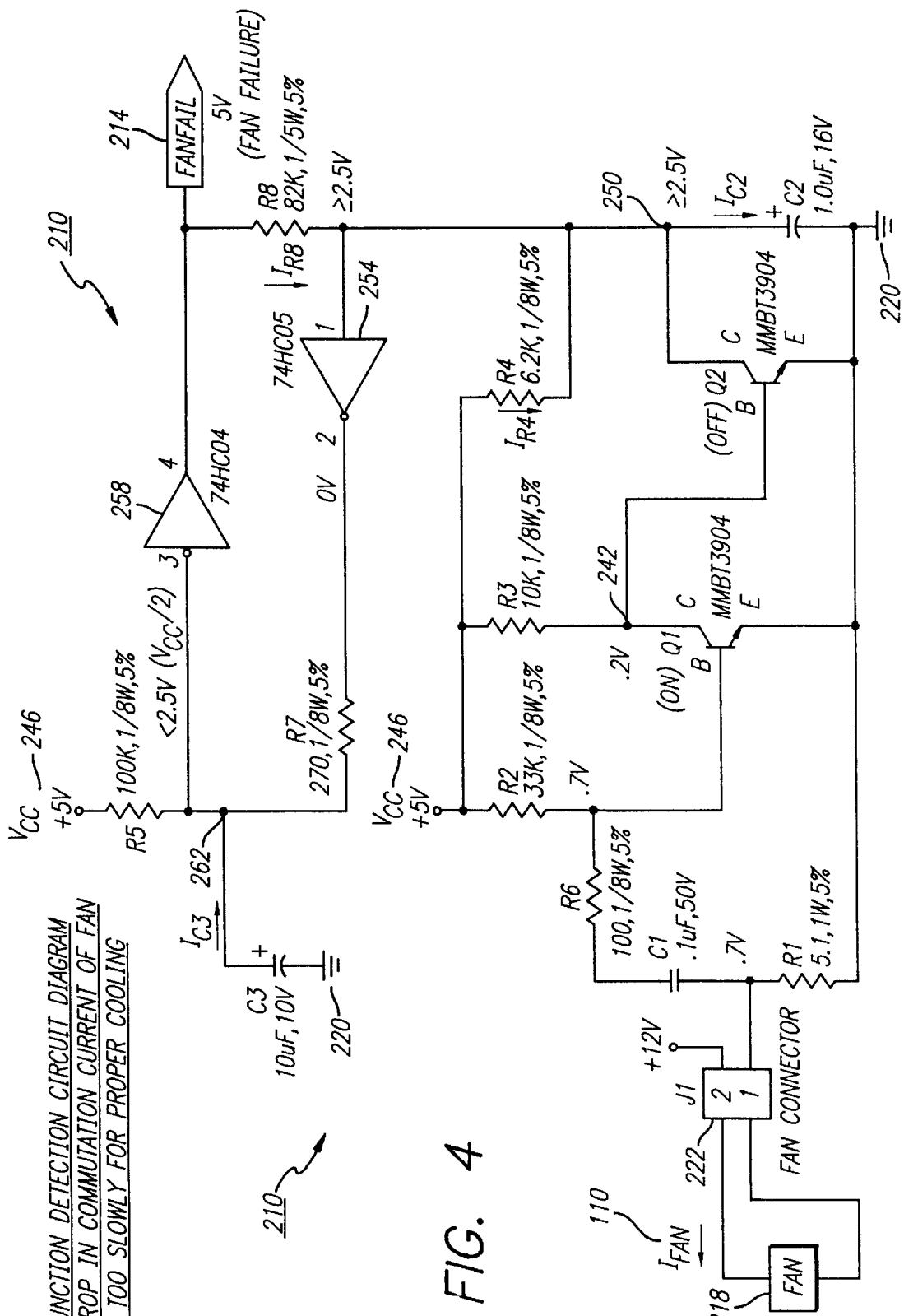
FIG. 4 is the circuit diagram for the fan malfunction detection circuit illustrating voltages and currents when the fan is spinning too slowly for proper cooling of the device, in accordance with the preferred embodiment of FIG. 2.

FIG. 4 illustrates the voltages and currents in the circuit 210, when the fan 218 is spinning too slowly for proper cooling of the device, i.e. one-fourth of the period of rotation $T_R$ 118 is too long. In FIG. 4, the time between fan current drops 114 is so long that the voltage at node 250 increases to 2.5 volts or greater. This increase in voltage at node 250 occurs as discussed in the context of FIG. 2. As also explained above, a voltage of 2.5 volts or greater at pin 1 of inverter 254 will cause pin 2 of inverter 254 to go low, i.e. to 0 volts. Since inverter 254 preferable is an open drain (or open collector) device, the inverter 254 can sink capacitor current $I_{C3}$, thus allowing capacitor C3 to begin discharging. Current $I_{C3}$ tends not to flow into pin 3 of inverter 258. Since inverter 258 is a CMOS gate, the input impedance at its pin 3 is high, whereas the output impedance at pin 2 of inverter 254 is low. Once the voltage at node 262 drops below 2.5 volts, pin 4 of inverter 258 goes high, i.e. to 5 volts, thereby indicating that fan 218 is spinning too slowly for cooling the device. As mentioned above, once fan fail output 214 goes high, current $I_{R8}$ through resistor R8 swiftens charging of capacitor C2, since fan fail output 214 is at a greater voltage than node 250.

Although relatively small, the resistance of resistor R7 is to substantially prevent disrupting the functioning of other inverters that may be linked to inverter 254. Typically, inverters, such as inverter 254, are manufactured in packages of, for instance, six inverters each. Moreover, typically the source terminals of the output transistors at the respective pins 2 of each inverter are tied together and to ground 220. Typically, there is a parasitic inductance between ground 220 and the tied together sources of the output transistors of the inverters in the package including inverter 254. Consequently, without resistor R7 limiting capacitor current $I_{C3}$, when pin 2 of inverter 254 goes low, the sudden start of current flow of capacitor current $I_{C3}$ could cause a voltage to be generated across the parasitic inductance. Such changes in voltage are commonly referred to as ground bounce. The voltage across the parasitic inductance could cause the output transistor of all of the inverters in the inverter package to turn off, due to an insufficient voltage drop from their respective gates to their respective sources.

Eventually, when fan 218 begins operating at the required period of rotation for sufficient cooling of the device, transistor Q2 will turn on (and off) again sufficiently frequently for capacitor C2 to discharge to a sufficiently low voltage level (less than Vcc/2) to set high the voltage at pin 2 of inverter 254. However, charging of capacitor C2 is swiftened by current $I_{R8}$ through resistor R8. As explained above, the presence of resistor R8 creates hysteresis in charging capacitor C2. Since the voltage at node 250 is at 5 volts or less, current $I_{R8}$ flows, as indicated by the arrow in FIG. 4, as long as the fan fail output 214 is high.

Without proper selection of resistors R7 and capacitor C3, the voltage at the fan fail output 214 could potentially flutter between 0 and 5 volts, due to the fan 218 malfunctioning only intermittently. Fluttering of the voltage at fan fail output 214 could be caused by the fan fail output voltage being immediately responsive to the voltage at pin 1 of inverter 254. Such fluttering may result, for example, in a warning light (coupled to the fan fail output 214) blinking too fast for a user to notice.

To prevent fluttering of the fan voltage at the fan fail output 214, the value of the capacitance of capacitor C3 and the value of the resistance of resistor R7 are selected to have a very small time constant, i.e. capacitor C3 discharges very quickly through resistor R7. In the fan failure detection circuit 210, the time constant of capacitor C3 and resistor R7 is about 2.7 milli-seconds. So, capacitor C3 discharges about 63 percent of its 5 volts in only 2.7 milli-seconds. So, in less than 2.7 milliseconds the fan fail output 214 will go high, unless, before a time period equal to the time constant of capacitor C3 and resistor R7 has elapsed, there is a drop in magnitude 114 of the fan current 110. After capacitor C3 has been substantially discharged, then even a brief drop to 0 volts of the voltage at pin 1 of inverter 254 does not cause the voltage at the fan fail output 214 to go high. This is because the charging of capacitor C3 is controlled by a time constant of the capacitance C3 and the resistance of resistor R5. (The hysteresis provided by resistor R8 also reduces fluttering.)

The values of the resistance of resistor R5 and of the capacitance of capacitor C3 are selected such that capacitor C3 charges to approximately 63 percent of the power supply voltage 246 within one second. In other words, the resistance of R5 and the capacitance of C3 are selected to have a time constant of about one second. So, in less than one second, capacitor C3 charges to a voltage of greater than 2.5 volts, thus resulting in a low voltage at the fan fail output 214. So, pin 1 of inverter 254 needs to remain at a voltage below 2.5 volts for a little less than one second, before the voltage at the fan fail output 214 will go low. Of course, other time constants can be selected for capacitor C3 and resistor R5 and for capacitor C3 and resistor R7 by selecting other values for the capacitance of capacitor C3, for the resistances of resistors R5 and R7.

Similarly, the time constant for charging capacitor C2 can be set. This time constant drives how quickly the output voltage at the fan fail output 214 goes high, unless a drop in fan current 114 occurs in time. The time constant for charging capacitor C2 is set by selecting the capacitance of capacitor C2 and the resistance of resistor R4. (As discussed above, the hysteresis effect of resistor R8 also affects this time constant.) In this fashion, the fan malfunction detection circuit 210 can be set for having the fan fail output 214 go high for various periods of rotation of fan 218.

Figure 5:
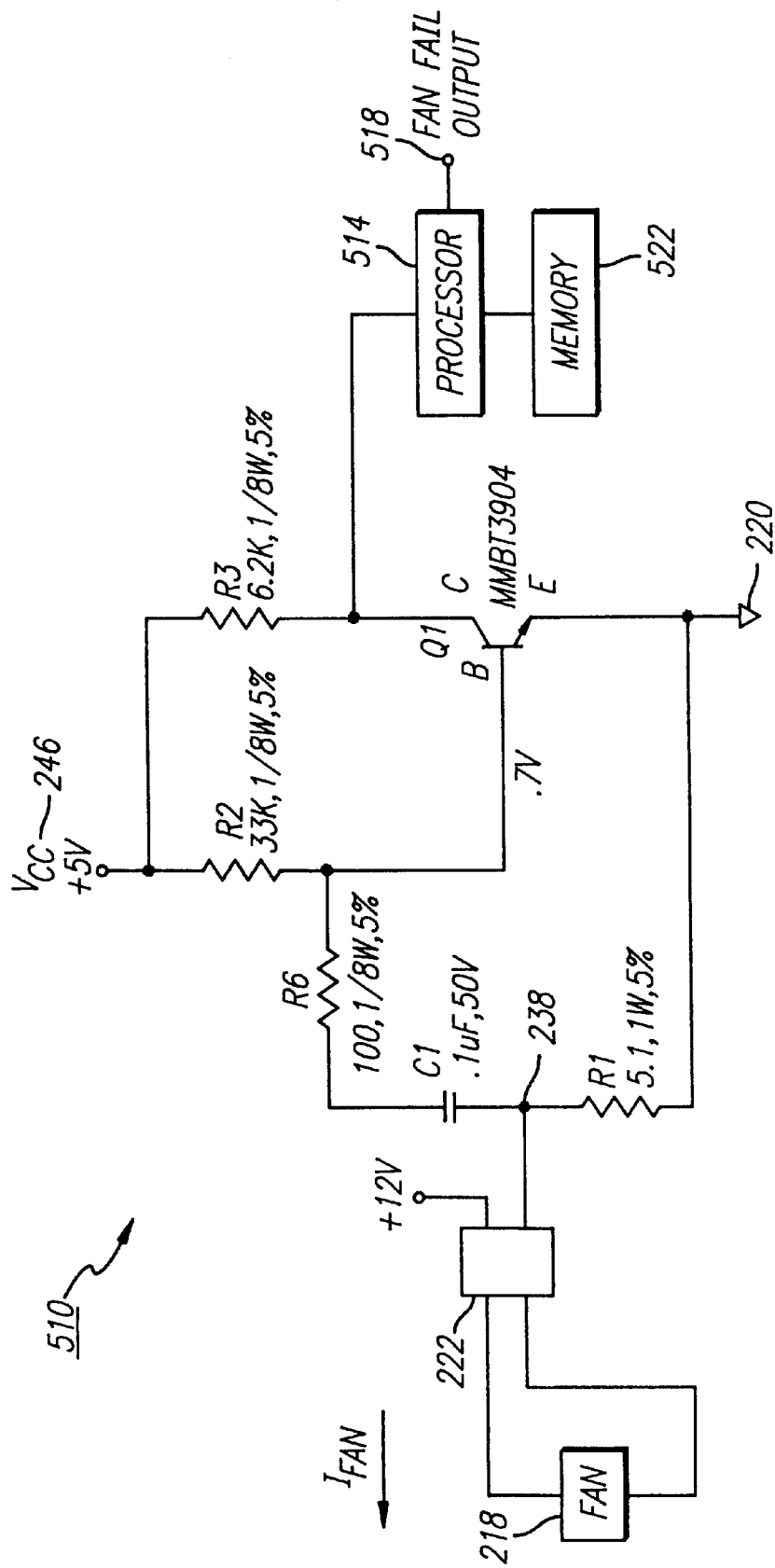
FIG. 5 is a circuit diagram for a fan malfunction detection circuit operable with a microprocessor, in accordance with a preferred embodiment of the invention.

FIG. 5 shows a circuit diagram for a fan malfunction detection circuit 510 operable with a microprocessor 514. The fan malfunction detection circuit 510 is a modified version of fan malfunction detection circuit 210. In the fan malfunction detection circuit 510, a processor 514 with an associated fan fail output 518 has replaced transistor Q2 and the associated components as well as capacitor C3 and resistor R5 and the associated components thereof.

In the fan malfunction detection circuit 510, the processor 514 is connected to the collector C of transistor Q1. Thus, processor 514 can sample the voltage at the collector C of transistor Q1. Before a drop 114 in the fan current 110, the voltage at the collector C of transistor Q1 is approximately 0.2 volts, i.e. the saturation voltage of transistor Q1. As explained above, once a fan current drop 114 occurs, transistor Q1 turns off. Then the voltage at the collector C of transistor Q1 jumps to 5 volts, i.e. the voltage of power supply 246. In this way, the circuit 510 (as does circuit 210) creates a series of voltage pulses at collector C of transistor Q1. Using instructions stored in a memory 522, the processor 514 computes the time elapsed between changes in voltage between 0.2 volts and 5 volts at the emitter E of transistor Q1. Based on this computation, the processor 514 generates a high voltage at fan fail output 518, when the fan 218 spins too slowly. The instructions in memory 522 specify for which time period between a 0.2 volts and a 5 volt signal at the collector C of transistor Q1 the processor 514 sets the fan fail output 518 high. The processor 514 can store in memory 522 speed information of fan 218 with respect to time. Collecting fan speed data can aid in failure prediction analysis of the fan 218.

Several preferred embodiments of the present invention have been described. Nevertheless, it will be understood that various modifications may be made without departing from the spirit and scope of the invention. For example, the discussion above has been in terms of fans. But, it will be clear to one of ordinary skill in the art based on the above description, in other embodiments, for example, the invention can be used with any motors, indeed with any devices, to detect changes in current.

Moreover, the discussion above has been in terms of open drain (or open collector) inverter gate 254. However, as will be clear to one of ordinary skill in the art based on the above description, in other embodiments, for example, the inverter 254 may be a standard (non-open drain or non-open collector) gate in series with a diode, such as a Schottky diode. This diode would have its cathode connected to pin 2 of inverter 254. A consequence of such a diode is that due to the diode, capacitor C3 would be unable to discharge completely. Consequently, capacitor C3 would require less time to charge to 5 volts than it would without the diode. Furthermore, one of ordinary skill in the art would understand based on the above description, that in other embodiments, for example, inverters 254 and 258 could change voltages at pins 2 and 4, respectively, for voltages at pins 1 and 3, respectively, of less than Vcc/2, such as at 1.8 volts for TTL gates.

Moreover, to provide an analog indication of the speed of the fan rotation, an integrator could be coupled to node 250 for integrating the voltage across capacitor C2. The result of the integration would be inverted for an analog indication of the rotation speed of fan 218. As one of ordinary skill in the art will understand based of the description herein, the reason for the inversion is that a larger voltage at node 250 indicates a slower speed of rotation of fan 218. Instead of inverting the voltage signal at node 250, the circuit of FIG. 2–4 can be implemented in a complementary PNP bipolar junction transistor version. In this PNP version, the voltage at node 250 would charge to, for instance, $V_{CC}$ for every fan current drop event and then discharge via resistor R4, whose other end would be grounded instead of tied to $V_{CC}$. Instead of using a resistor, a constant current source could replace resistor R4. Such a constant current source would preserve linearity of the discharging of capacitor C2 for a linear indication of the speed of rotation of the fan 218. In this PNP version, both transistors Q1 and Q2 would be PNP transistors.

With respect to the embodiment of FIG. 5, one of ordinary skill in the art would understand based on the above description that the microprocessor 514 can provide a continuous read-out of an indication of the fan speed. Based on the description herein, one of ordinary skill in the art also would understand that FIG. 5 in another embodiment maybe further modified by having a microprocessor sense voltages directly at node 238. Preferably, resistor R1 would be selected for providing a sufficiently high voltage for a logic one for the particular microprocessor and a sufficiently low voltage for a logic zero. However, a voltage across resistor R1 of, for instance, greater than 2.5 volts for a typical value of a logic one would generate extra heat and possibly slow down the frequency of rotation of fan 218 due to less current being available to power the motor of fan 218. In spite of these possible disadvantageous, in some applications such a simplified version of the circuit of FIG. 5 may be desirable. Thus, the present invention is not limited to the preferred embodiments described herein, but may be altered in a variety of ways, which will be apparent to persons skilled in the art based on the present description.

What is claimed is:

1. An apparatus adapted to monitor its operation, the apparatus comprising:

a device adapted to operate when supplied power;

a pulse detection circuit for generating a trigger signal depending on the frequency of periodic drops in current magnitude of a current flowing through the device relative to a first frequency value, and for canceling the trigger signal depending on the frequency of periodic drops in current magnitude of the current flowing through the device relative to a second frequency value which is different than the first frequency value, wherein the trigger signal comprises a variable analog voltage; and a pulse decision circuit coupled to the pulse detection circuit for providing an output signal indicative of the frequency of periodic drops in the current magnitude of the current flowing through the device in response to the trigger signal, wherein the output signal indicates whether the device is operating properly.

2. The apparatus as recited in claim 1, wherein the pulse detection circuit further comprises:

a first transistor;

a first resistor for coupling to the current; and a first capacitor coupled between the first resistor and the first transistor for turning on and off the first transistor to generate a pulse signal representative of the frequency of periodic drops in current magnitude of the current flowing through the device.

3. The apparatus as recited in claim 2, further comprising a current limiting resistor coupled between the first capacitor and the first transistor.

4. The apparatus as recited in claim 3, wherein the current limiting resistor has a substantially greater resistance than the resistance of the first resistor.

5. The apparatus as recited in claim 1, wherein the pulse detection circuit and the pulse decision circuit further comprises:

a capacitor;

a resistor coupled to a first end of the capacitor and for coupling to the current;

a transistor coupled to a second end of the capacitor opposite the first end, the capacitor turning on and off the transistor to generate a pulse signal; and a processor coupled to the transistor for providing the output signal indicative of the frequency of periodic drops in the current magnitude of the current flowing through the device in response to the pulse signal.

6. The apparatus as recited in claim 2, wherein the pulse detection circuit further comprises:

a second capacitor;

a second resistor coupled to the second capacitor; and a second transistor coupled to the second capacitor, to the second resistor, and to the first transistor, wherein the second transistor turns on and off when the first transistor is turned off and on, respectively, and further generates a trigger signal.

7. The apparatus as recited in claim 1, wherein the pulse decision circuit further comprises:

a first capacitor; and a first resistor coupled to the first capacitor for setting to a first value the output signal, when the frequency of periodic drops in current magnitude of the current flowing through the device is greater than the first frequency value.

8. The apparatus as recited in claim 7, wherein the pulse decision circuit further comprises a second resistor coupled to the first capacitor for setting to a second value the output signal, when the frequency of periodic drops in current magnitude of the current flowing through the device is less than the first frequency value.

9. The apparatus as recited in claim 1, wherein the pulse decision circuit further comprises:

a capacitor having a capacitance;

a first resistor having a resistance coupled to the capacitor for setting to a first value the output signal, when the frequency of periodic drops in current magnitude of the current flowing through the device is greater than the first frequency value; and a second resistor having a resistance coupled to the capacitor for setting to a second value the output signal, when the frequency of periodic drops in current magnitude of the current flowing through the device is less than the first frequency value, the capacitance of the capacitor and the resistances of the first and second resistors being such that a first time constant defined by the capacitance of the capacitor and the resistance of the first resistor is substantially greater than a second time constant defined by the capacitance of the capacitor and the resistance of the second resistor.

10. The apparatus of claim 1, wherein the pulse decision circuit further comprises a hysteresis inducing resistor coupled between the output and the pulse detection circuit for controlling the second frequency value.

11. The apparatus as recited in claim 1, wherein the pulse decision circuit further comprises a first inverter, a first time constant resistor, a capacitor, a second time constant resistor, and a second inverter, wherein the first and second inverters are coupled to the output, the first time constant resistor is coupled between the first inverter and the second time constant resistor which is coupled to the capacitor and to the second inverter.

12. An apparatus adapted to monitor its operation, the apparatus comprising:

a device adapted to operate when supplied power;

a pulse detection circuit for generating a trigger signal indicative of the frequency of periodic drops in current magnitude of a current flowing through the device relative to a first frequency value, and for canceling the trigger signal depending on the frequency of periodic drops in current magnitude of the current flowing through the device relative to a second frequency value which is different than the first frequency value, wherein the trigger signal comprises a variable analog voltage; and a processor coupled to the pulse detection circuit for providing an output signal indicative of the frequency of periodic drops in the current magnitude of the current flowing through the device in response to the trigger signal, wherein the output signal indicates whether the device is operating properly.

13. A process for sensing a frequency of periodic drops in current magnitude of a current flowing through a device, the process comprising the steps of:

providing a trigger signal depending on the frequency of periodic drops in current magnitude of a current flowing through a device relative to a first frequency value, wherein the trigger signal comprises a variable analog voltage;

generating an output signal indicative of the frequency of periodic drops in the current magnitude of the current flowing through a device relative to the trigger signal; and canceling the trigger signal depending on the frequency of periodic drops in current magnitude of the current flowing through a device relative to a second frequency value which is different than the first frequency value, wherein the output signal indicates whether the device is operating properly.

14. An apparatus for sensing a frequency of periodic drops in current magnitude of a current flowing through a device, the apparatus comprising:

means for generating a trigger signal depending on the frequency of periodic drops in current magnitude of a current flowing through the device relative to a first frequency value, wherein the trigger signal comprises a variable analog voltage;

means for generating an output signal indicative of the frequency of periodic drops in the current magnitude of a current flowing through the device relative to the trigger signal; and means for canceling the trigger signal depending on the frequency of periodic drops in current magnitude of a current flowing through the device relative to a second frequency value which is different than the first frequency value, wherein the output signal indicates whether the device is operating properly.

* * * * *